United States Patent [19]

Mecklenburg

[11] 4,080,566
[45] Mar. 21, 1978

[54] RF DIRECTIONAL WATTMETER

[75] Inventor: Frank Howard Mecklenburg, Shaker Heights, Ohio

[73] Assignee: Bird Electronic Corporation, Solon, Ohio

[21] Appl. No.: 719,565

[22] Filed: Sep. 1, 1976

[51] Int. Cl.$^2$ .................... G01R 21/04; G01R 27/06
[52] U.S. Cl. .................... 324/95; 324/58 B; 324/156
[58] Field of Search .................... 324/95, 58 R, 58 B, 324/156

[56] References Cited

U.S. PATENT DOCUMENTS

| | | | |
|---|---|---|---|
| 2,412,393 | 12/1946 | Ghosh | 324/58 B |
| 2,818,547 | 12/1957 | Laemmel | 324/58 B |
| 2,822,517 | 2/1958 | Cohn | 324/58 B |

OTHER PUBLICATIONS

Lafayette Electronics Catalog; 1976; Lafayette Rad. Electronics; Syosset, N.Y., 11791; pp. 1, 2, 205.
Furukawa et al., "Admittance Measurements . . ."; Electronic & Comm. in Japan, vol. 52-B, No. 6; 1969; pp. 65-72.

Primary Examiner—Rudolph V. Rolinec
Assistant Examiner—Ernest F. Karlsen
Attorney, Agent, or Firm—Bosworth, Sessions & McCoy

[57] ABSTRACT

An electronic instrument module for detecting and measuring the forward and reflected RF voltage wave signals on a coaxial transmission line. The instrument is integral with a coaxial line section adapted to be electrically inserted in a tubular transmission line, the line section having an elongated conductive metal body with a central cylindrical opening with a coaxial center conductor therein electrically insulated from the metal body. The metal body also has a transverse opening communicating with the central cylindrical opening and adapted to receive an inductive pick-up coil mounted on the body for rotation in the opening about an axis normal to the axis of the line section. The pick-up coil is responsive to the voltage wave signal on the transmission line. Also, mounted on the metal body are a D'Arsonval meter movement and circuit means connecting the pick-up coil to the meter movement so that the meter provides an indication of the level of either the forward voltage wave signal or the reflected voltage wave signal depending on the orientation of the inductive pick-up coil.

2 Claims, 9 Drawing Figures

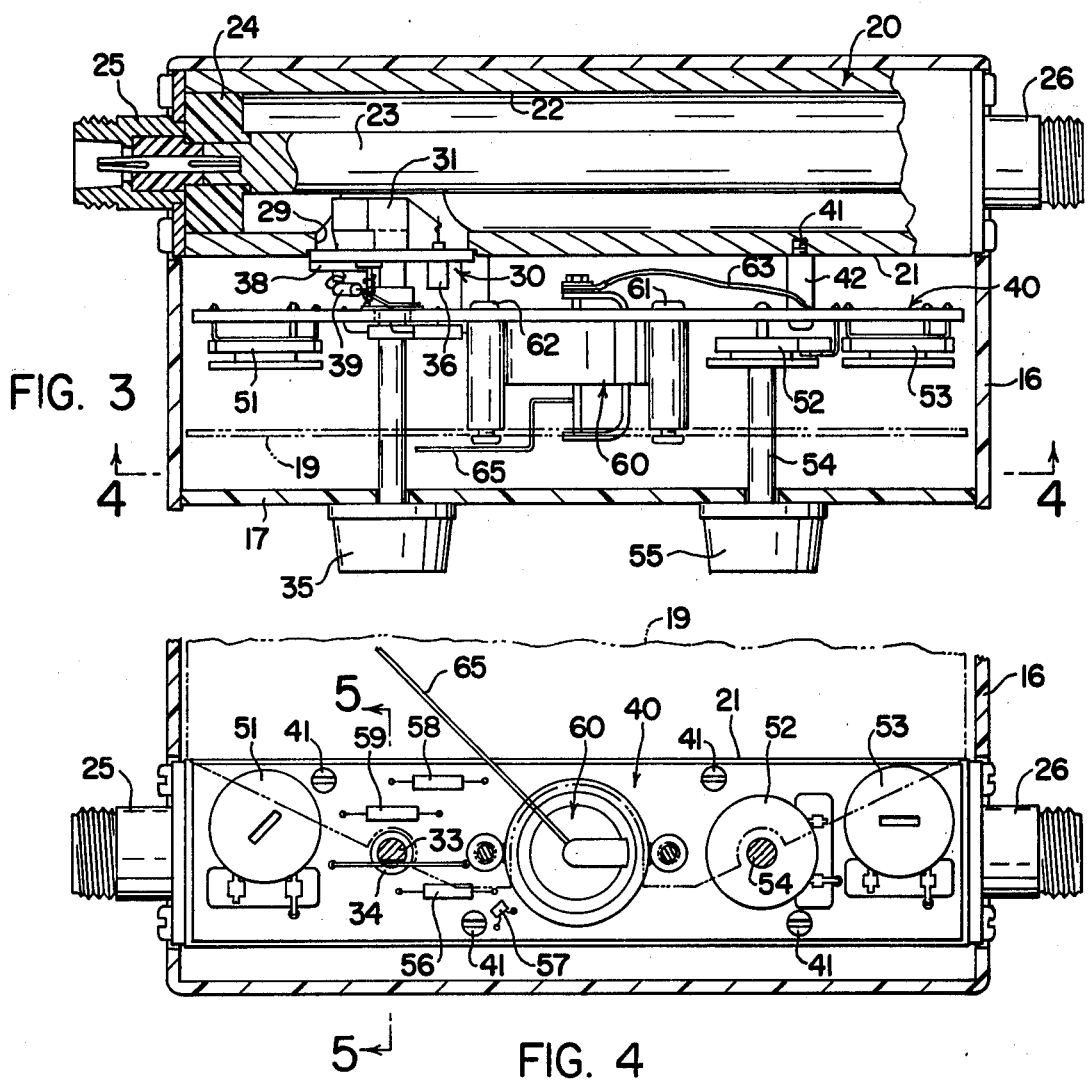
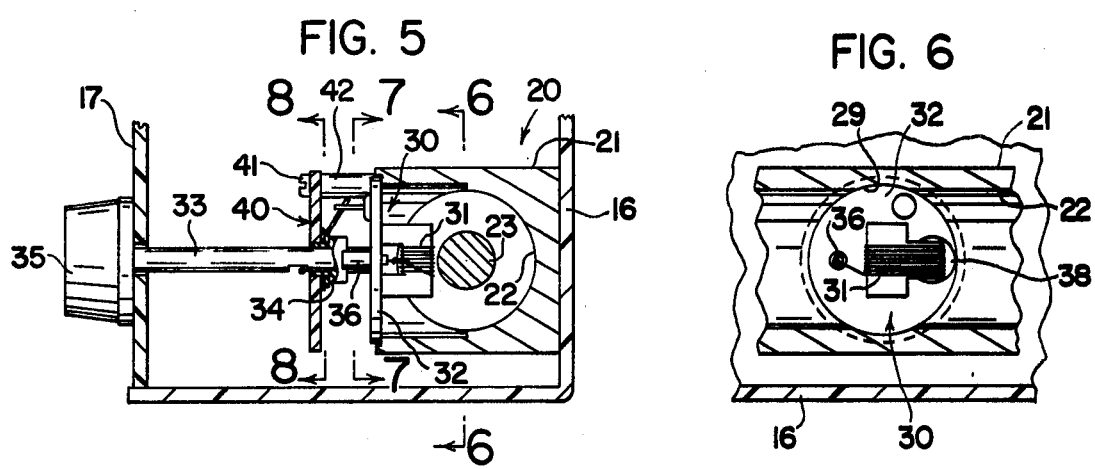

RF DIRECTIONAL WATTMETER

BACKGROUND OF THE INVENTION

This invention relates to electronic instruments for detecting and measuring RF voltage wave signals on coaxial transmission lines such as between a transmitting antenna and a transmitter. More particularly, the invention relates to an "insertion-type" RF directional wattmeter for detecting and measuring both the forward and reflected voltage wave signals on a coaxial transmission line and particularly for installation in a vehicle utilizing "Citizen' Band" (CB) radio equipment and a 50 ohm coaxial cable between the transmitter and the antenna.

Insertion-type RF directional wattmeters are used in many applications in the RF field, particularly, in matching antennas to transmission lines and in minimizing the voltage standing wave ratio (VSWR) on the line. One application that is becoming increasingly important is in connection with CB transmitters that are currently so popular in the United States for use in automotive vehicles. These installations require accurate impedance matching in view of the limited power permitted.

Meters currently available for this application are, for example, of the type disclosed in U.S. Pat. Nos. 2,852,741 and 2,891,221. Units embodying the inventions of these patents are high-quality type instruments of fairly expensive construction and while they are entirely suitable for CB applications they are in many instances too expensive for use by the average CB radio operator.

The principle of operation of these units is based on the use of a rigid, coaxial line section that is inserted in the coaxial transmission line such as by standard coaxial connectors. An inductive pick-up coil positioned in a transverse opening in the outer conductor is adapted for rotation about an axis normal to the axis of the line section. The pick-up coil is connected by special leads to a D'Arsonval meter movement and the resulting meter reading indicates the magnitude of the wave signal in watts, the indication being either that of the magnitude of the forward voltage wave level or the reflected voltage wave level depending upon the particular orientation of the pick-up coil.

A loop located in the electrical field between the inner and outer conductors of a coaxial transmission line has a voltage induced therein proportional to the current I in the inner conductor, there being a mutual inductance M between the loop and the transmission line and the loop being positioned in the plane of the inner conductor of the line. A series circuit of resistance R and capacitance C connected across the transmission line conductors will give a voltage across the resistance R proportional to the voltage E between the line conductors. In directional coupler and so-called reflectometers the arrangements mentioned are combined in a sampling circuit in which the resistor R is connected in series with the loop and capacitive coupling is provided as by capacitor plates or armatures on the loop and the inner conductor, or by capacitance effects between the components of the sampling circuit and the inner conductor.

Considering the sampling circuit mentioned and using lumped impedances, it is apparent that M is either positive or negative depending upon the directional relation between the loop and the wave signal energy traveling on the line.

The instrument described obtains reversal of the mutual inductance M through 180° rotation of the loop relative to the transmission line. The forward traveling wave has voltage $E_f$ and current $I_f$ while the reflected traveling wave has voltage $E_r$ and current $I_r$. Thus, if $Z_o$ be the characteristic impedance of the line and $p$ the reflection coefficient:

$$p = E_r/E_f = -I_r/I_f$$

and $$e = jw\,(CRE + MI)$$

$$= jwE_f[CR(1+p) + (M/Z_o)(1-p)]$$

where $e$ is the total electromotive force induced in the loop or sampling circuit. The components are selected so that:

$$RC = M/Z_o = K$$

$k$ being a constant. If we let $e$ be the electromotive force when M is positive so that the voltage across R and the voltage induced in the loop are additive, and let $e-$ be the elctromotive force when M is negative and the voltages referred to are opposed, the former gives a maximum and the latter a minimum indication, thus:

$$e = jwE_f[K(1+p) + K(1-p)]$$

$$= 2jwE_fK$$

$$e- = jwE_f[K(1+p) - K(1-p)]$$

$$= 2jwE_fK_p$$

from which the reflection coefficient and standing wave ratio can be obtained. It is also feasible to measure power P being fed through the transmission line:

$$P = EI \cos\theta = E \cdot I$$
$$= (E_f + E_r) \cdot (I_f + I_r)$$
$$= \frac{E_f \cdot E_f}{Z_o} - \frac{E_r \cdot E_r}{Z_o}$$
$$= \frac{|E_f|^2}{Z_o}(1 - |p|^2)$$
$$= \frac{|e+|^2 - |e-|^2}{4w^2K^2Z_o}$$

As indicated above, current models available containing this system for detecting and measuring the forward and reflected RF wave signals on a coaxial transmission line are high quality, relatively expensive instruments not usually practical for CB installations. For CB installation, a model capable of operation within a limited frequency range and a carefully controlled power range are all that are required. Interchangeable pick-up cartridges are not necessary and it is not necessary that the line section be a separate portable element or that it be capable of removal from the instrument housing for operation remotely as in the case of prior art models embodying this principle.

The instrument of the present invention satisfies the requirements indicated above and affords other features and advantages heretofore not obtainable.

SUMMARY OF THE INVENTION

It is among the objects of the invention to provide an electronic instrument module for detecting and measuring the forward and reflected RF voltage signals on a coaxial transmission line within a specific limited frequency range and a specific limited power range, the instrument being adapted for mounting in association with portable radio equipment.

Another object of the invention is to provide an electronic instrument of the type described, having a more economical construction.

Still another object of the invention is to simplify the construction of electronic instruments for detecting and measuring the forward and reflected RF voltage wave signals on a coaxial transmission line, especially a coaxial cable between a transmitting antenna and a CB transmitter.

These and other objects and advantages are achieved with the unique instrument construction of the invention. The instrument comprises a coaxial line section adapted to be inserted in the transmission line and having a tubular rectangular conductive metal body and a coaxial center conductor electrically insulated from the body. The tubular metal body has a transverse opening and an inductive pick-up coil mounted in the opening for rotation about an axis normal to the axis of the line section for sensing and measuring either the forward RF voltage wave signal level or the reflected RF voltage wave signal level in the transmission line.

The tubular metal body serves as the base for mounting a D'Arsonval meter movement for indicating on a meter scale the magnitude of the signal sensed by the pick-up coil. A printed circuit component mounted by fasteners and spacers to the tubular metal body is operatively connected between the meter movement and the inductive pick-up coil for converting the inductive voltage sensed by the pick-up coil to a voltage signal transmitted to the meter movement. Accordingly, the meter movement means gives a visual meter reading representative of either the forward voltage wave signal level or the reflected voltage wave signal on the transmission line depending on the particular orientation of the inductive pick-up coil.

BRIEF DESCRIPTION OF THE DRAWINGS

FIG. 3 is a sectional view taken on the line 3—3 of FIG. 2;

FIG. 4 is a fragmentary sectional view taken on the line 4—4 of FIG. 3;

FIG. 5 is a fragmentary sectional view taken on the line 5—5 of FIG. 4;

FIG. 6 is a fragmentary sectional view taken on the line 6—6 of FIG. 5;

DESCRIPTION OF THE PREFERRED EMBODIMENT

Figure 1:
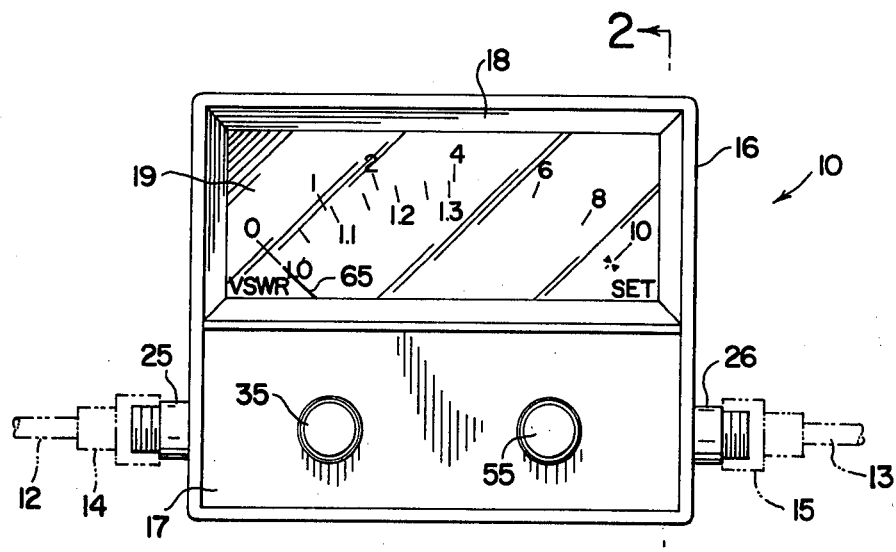
FIG. 1 is an elevational view of an electronic instrument for detecting and measuring the forward and reflected RF voltage wave signals on a coaxial transmission line in accordance with the invention.
Figure 2:
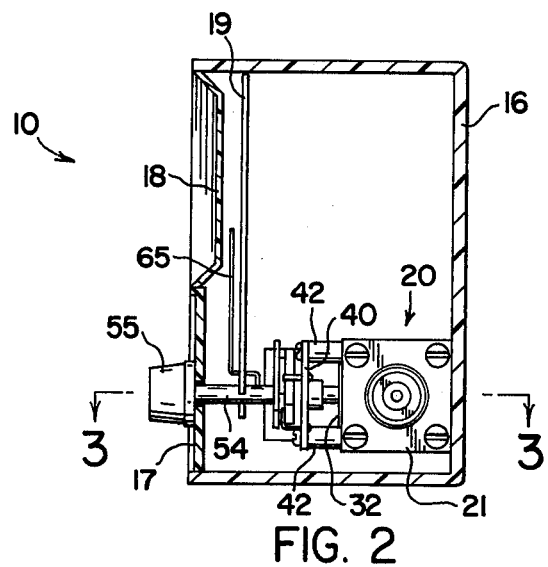
FIG. 2 is a sectional view taken on the line 2—2 of FIG. 1.
Figure 7:
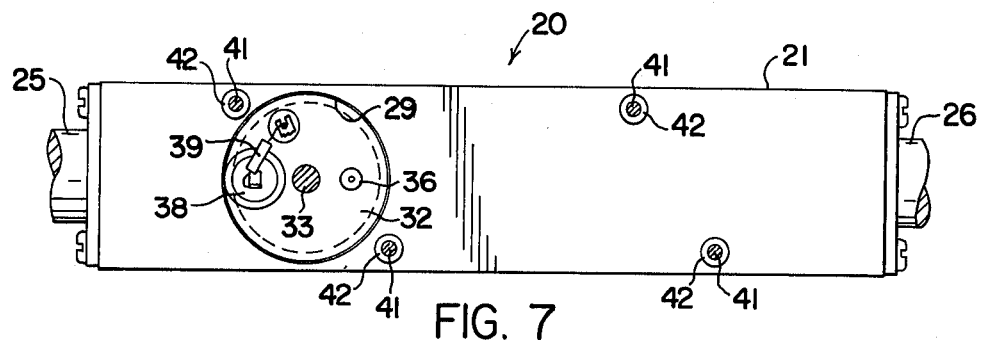
FIG. 7 is a sectional view taken on the line 7—7 of FIG. 5.

Referring more particularly to the drawings, there is shown an RF directional wattmeter 10 specifically designed in accordance with the invention and adapted for detecting and measuring the forward and reflected RF voltage wave signals on a coaxial transmission line connecting a portable CB unit (not shown) in an automobile to the externally mounted transmitting antenna. The ends 12 and 13 of the coaxial cable between which the instrument 10 is inserted have standard coaxial connectors 14 and 15 shown in dashed lines in FIG. 1 that are connected to the instrument 10. The instrument is anchored in a housing 16 of nonconductive molded material, that supportes a front panel 17 and a protective transparent window element 18 that protects a meter scale plate 19.

The instrument 10 includes as basic components a line section 20, an inductive pick-up coil element 30, a printed circuit board 40 with associated circuit components, and a D'Arsonval meter movement assembly 60. All of the above components 30, 40 and 60 are connected to and supported by the line section 20. The line section 20 comprises a tubular conductive metal body 21 formed of aluminum, for example, and defining a longitudinally extending cylindrical space 22 therein. Located within the space 22 is a center conductor 23 supported by and electrically insulated from the tubular body 21 by annular insulators 24 (FIG. 3). Located at each end of the conductive metal body 21 are female-type coaxial connectors 25 and 26 that receive the male-type coaxial cable connectors 14 and 15.

The tubular body 21 has a relatively large transverse bore 29 formed therein, a communicating with the cylindrical space 22 (FIGS. 3, 5 and 6). Located partly within the bore 29 and supported by the metal body is a conductive pick-up assembly 30 constructed generally in accordance with U.S. Pat. Nos. 2,852,741 and 2,891,221. The assembly 30 has an inductive pick-up coil 31 at its inner end positioned within the space 22 and a mounting plate on which the coil 31 and associated circuit components are mounted. The coil 31 and swivel plate 32 are mounted on a shaft 33 journaled in a bushing 34 secured in the printed circuit board 40. A control knob 35 permits rotation of the shaft 33 and corresponding rotation of the pick-up coil 31 so that the coil may be rotated to a position adapted to sense and measure the forward RF voltage wave signal or, on the other hand, a position adapted to sense and measure the reflected RF voltage wave signal level.

The circuit components in the assembly 30 include a sampling resistor 36, a band broadening shunt condenser 38 and a series resistor 39.

Figure 8:
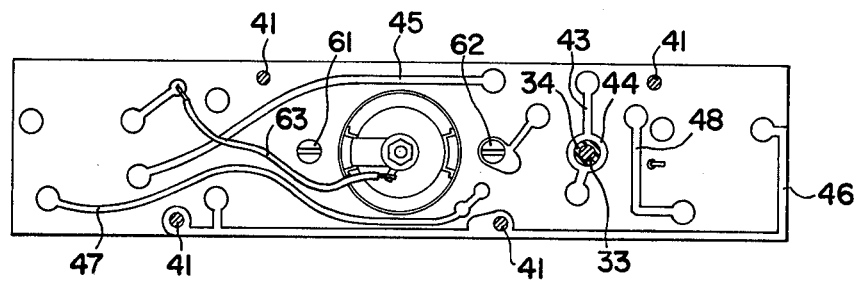
FIG. 8 is a sectional view taken on the line 8—8 of FIG. 5.
Figure 9:
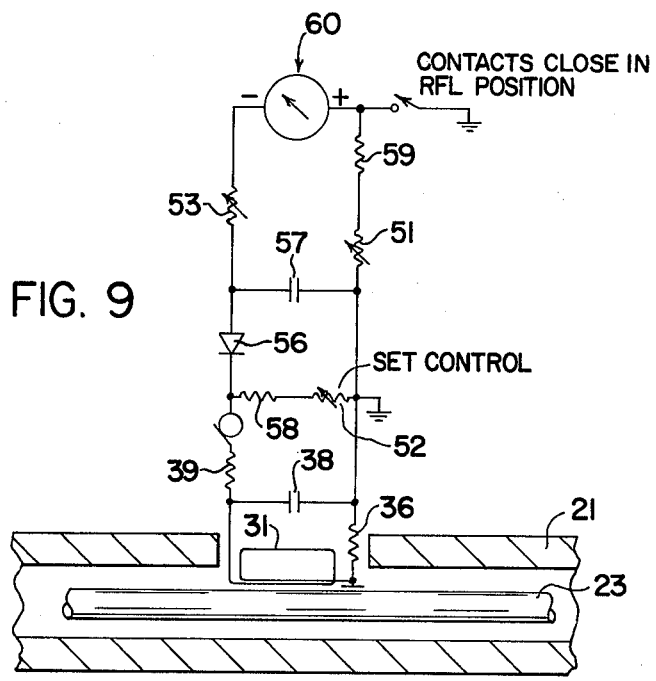
FIG. 9 is a view illustrating in diagrammatic form the coaxial line section and showing in diagrammatic form the electrical circuitry of a unit embodying the invention.

The circuit board 40, best illustrated in FIG. 8, is supported on and spaced from the body by means of screws 41 and conductive spacer sleeves 42 which provide a ground connection. The conductive leads printed on the circuit board include a lead 43 extending from a circular wiper contact zone 44 concentric with shaft 33 of element 30 and extending to a shunt resistor 58. Another conductive lead 45 extends from the shunt resistor 58 to the scale expanding potentiometer 52. Also connected to the circular wiper contact zone is a rectifier diode 56 of the germanium crystal type. Another conductive lead 47 extends from the rectifier diode 56 to a charge condenser 57 and to a variable calibrating potentiometer 53. A ground conductive lead 46 connects the spacer sleeves 42 to the scale expanding potentiometer 52, the charge condenser 57, and a second variable calibrating potentiometer 51. Another conductive lead 48 connects the variable calibrating potentiometer 51 to a fixed calibration resistor 59 which is connected electrically to the positive terminal of the D'Arsonval movement.

The D'Arsonval meter movement assembly 60 is also mounted to the circuit board by screws 61 and 62 and is electrically connected by lead 63. Accordingly, the meter movement 60 which will not be described in detail herein causes the needle to deflect across a meter scale 70 calibrated in watts.

While the invention has been shown and described with respect to a specific embodiment thereof, this is intended for the purpose of illustration rather than limitation and other modifications and variations in the specific form herein shown and described will be apparent to those skilled in the art all within the intended spirit and scope of the invention. Accordingly, the patent is not to be limited in scope and effect to the specific embodiment herein shown and described nor in any other way that is inconsistent with the extent to which the progress in the art has been advanced by the invention.

I claim:

1. In an instrument for detecting and measuring directional RF voltage wave signals on a coaxial transmission line, said instrument including a coaxial line section adapted to be inserted in said transmission line and having a tubular conductive metal body with a central axis and a transverse opening, and a coaxial center conductor extending axially through said body and electrically insulated therefrom, an inductive pick-up coil located in said opening and adapted for rotation about an axis normal to the axis of said metal body for sensing and measuring the RF voltage wave on said transmission line, D'Arsonval meter movement means for indicating on a meter scale the magnitude of said voltage wave on said transmission line, circuit means operatively connected between said meter movement means and said inductive pick-up coil for translating said inductive voltage sensed by said pick-up coil into a voltage signal transmitted to said meter movement means and an enclosure for said instrument, the improvement wherein said tubular conductive metal body is of rectangular cross section and is formed of a solid length of conductive metal with an axial bore extending therethrough and wherein said D'Arsonval meter movement means, said circuit means and said enclosure are all mounted on and supported solely by said conductive metal body whereby said line section alone serves as the base and support for said entire instrument independently of said enclosure.

2. An instrument as defined in claim 1 wherein said conductive metal body has a generally rectangular transverse cross-sectional shape.

* * * * *